US007148971B2

(12) United States Patent
Stiblert et al.

(10) Patent No.: US 7,148,971 B2
(45) Date of Patent: Dec. 12, 2006

(54) APPARATUS FOR MEASURING THE PHYSICAL PROPERTIES OF A SURFACE AND A PATTERN GENERATING APPARATUS FOR WRITING A PATTERN ON A SURFACE

(75) Inventors: Lars Stiblert, Gothenburg (SE); Peter Ekberg, Lidingo (SE)

(73) Assignee: Micronic Laser Systems AB, Täby (SE)

( * ) Notice: Subject to any disclaimer, the term of this patent is extended or adjusted under 35 U.S.C. 154(b) by 291 days.

(21) Appl. No.: 10/772,239

(22) Filed: Feb. 6, 2004

(65) Prior Publication Data

US 2004/0150707 A1   Aug. 5, 2004

Related U.S. Application Data

(63) Continuation of application No. 10/692,863, filed on Oct. 27, 2003.

(51) Int. Cl.
*G01B 11/24* (2006.01)
(52) U.S. Cl. ..................................... 356/601
(58) Field of Classification Search ............... 356/601, 356/609, 630; 355/52
See application file for complete search history.

(56) References Cited

U.S. PATENT DOCUMENTS 4,730,927 A   3/1988   Ototake et al.
5,386,294 A * 1/1995   Ototake et al. ............. 356/401
5,539,521 A * 7/1996   Otokake et al. ............ 356/601
6,549,271 B1 * 4/2003  Yasuda et al. ................ 355/55

FOREIGN PATENT DOCUMENTS

WO    WO 00/72090    11/2000

\* cited by examiner

*Primary Examiner*—Hwa (Andrew) Lee
*Assistant Examiner*—Isiaka O. Akanbi
(74) *Attorney, Agent, or Firm*—Harness, Dickey & Pierce, P.L.C.

(57) ABSTRACT

The present invention relates to a pattern generating apparatus for writing a pattern on a surface of an object, comprising: a stage having an object having a thickness (T) being provided with a surface, said surface being divided into a number of measurement points, where two adjacent measurement points being spaced a distance apart not exceeding a predetermined maximum distance; means to determine the gradient of the surface at each measurement point; means to calculate a 2-dimensional local offset (d) in the x-y plane for each measurement point as a function of the gradient, and the thickness (T) of object; and means to correct the pattern to be written on said surface by using the 2-dimensional local offset (d). The invention also relates to an apparatus for measuring the physical properties of a surface.

36 Claims, 8 Drawing Sheets

Average (nm): 10005138 Min (nm): -20705 Max (nm): 16664

APPARATUS FOR MEASURING THE PHYSICAL PROPERTIES OF A SURFACE AND A PATTERN GENERATING APPARATUS FOR WRITING A PATTERN ON A SURFACE

This application is a continuation of co-pending application Ser. No. 10/692,863, filed on Oct. 27, 2003, the entire contents of which are hereby incorporated by reference and for which priority is claimed under 35 U.S.C. § 120.

TECHNICAL FIELD OF THE INVENTION

The present invention relates to an apparatus for measuring the physical properties of the surface to determine the shape of the surface of a plate as defined in claim 1. The invention also relates to a pattern generating apparatus for writing a pattern on a surface, preferably on a glass plate made from quartz, for use in exposure equipment, or directly on a semiconductor material, as defined in claim 7.

BACKGROUND TO THE INVENTION

When a large display or part of a display, colour filter or other similar application, is produced, an exposure system transfer an image from a glass plate, preferably made from high quality quarts, onto a rather large substrate, which may have a dimension up to 1100 mm times 1300 mm or even more. The exposure system includes an aligner, or stepper, that emits light through the glass plate and onto the substrate, see FIG. 1. The glass plate is held in place by two rulers, or alternatively by a frame, and therefore the shape of the glass plate is deformed and the aligner, or stepper, compensates for this calculated deformation. The front side of the glass plate that carries the pattern of the image is arranged on the rulers, and a perfect reproduced image by the system on a substrate is dependent on that the front side of the glass plate is absolutely flat.

It is very important that the registration of masks, i.e. the absolute placement in a Cartesian coordinate system, is good enough to permit masks from different systems to fit together, e.g. the colour filter and the TFT-array. Furthermore, large TFT substrates may use two or more masks stitched together to cover a large exposure area.

In pattern generating systems for small plates, a three-foot device is used to support the plate during pattern generation and measurement, but the weight of a glass plate, with a thickness of 10 mm and a size of 1000×1000 mm, is approximately 40 kg, which will not be suitable to place on three pins. An alternative solution is to use an air cushion for plate support, but this introduces other problems like determining the exact position of the plate during exposure of the pattern. Another alternative is to handle the consequences that will arise when placing the plate directly on the stage (i.e. the support) of a pattern generating apparatus, although the plate will be deformed.

SUMMARY OF THE INVENTION

The object of the invention is to provide a apparatus for measuring a surface of an object being independent of any physical deformations that will occur when measuring the object.

This object is achieved by the apparatus as defined in claim 1.

A further object with the invention is to provide a pattern generating apparatus for writing a pattern on a surface of an object that is independent of any physical deformations that will occur when writing the pattern.

This object is achieved by the apparatus as defined in claim 7.

An advantage with the present invention is that unevenness in the support of the pattern generating apparatus (or measuring apparatus) will not introduce any error in the pattern or the measurement.

A further advantage is that any unevenness of the back surface and/or the front surface of the object, e.g. a glass plate or a semiconductor material, will not introduce any errors in the pattern or the measurement.

Still a further advantage with the present invention is that contamination in form of particles and/or air trapped between the object and the support can be compensated for, and therefore will not introduce any error in the pattern or measurement.

Still another advantage is that it is possible to even correct the deformation that will occur in the exposure equipment together with the deformation generated during the pattern writing process, provided that information regarding deformation in the exposure equipment is known when manufacturing the plate, as is disclosed in the published international patent application WO 00/72090 by the same applicant.

DETAILED DESCRIPTION OF PREFERRED EMBODIMENTS

Figure 1:
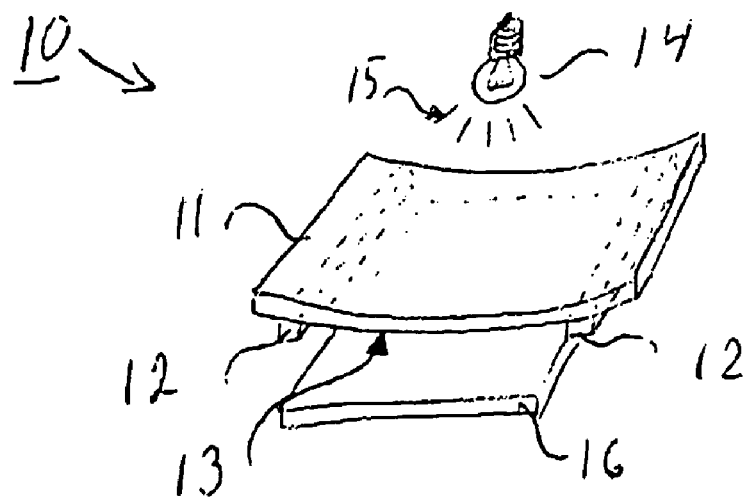
FIG. 1 shows an exposure system according to prior art.

FIG. 1 shows an exposure system 10 which uses a glass plate 11 resting on two rulers 12. The weight of the glass plate will cause the glass plate 11 to bend when placed on the rulers 12. The deformation of the glass plate caused by the weight is easy to calculate and can be corrected for. The glass plate 11 is provided with a pattern arranged on the downwards pointing surface 13 resting on the rulers 12. A light source 14 emits light 15 onto the glass plate 11 and the pattern arranged on the surface 13 of the glass plate 11 will produce a copy of the pattern on a substrate 16. The substrate 16 could be a TFT intended for a TV monitor. Normally, the pattern is transferred to the substrate 16 in a one-to-one relationship.

Other necessary optics is not shown in FIG. 1, since the purpose of the figure is to describe the function principals, rather than a complete exposure system.

Figure 2:
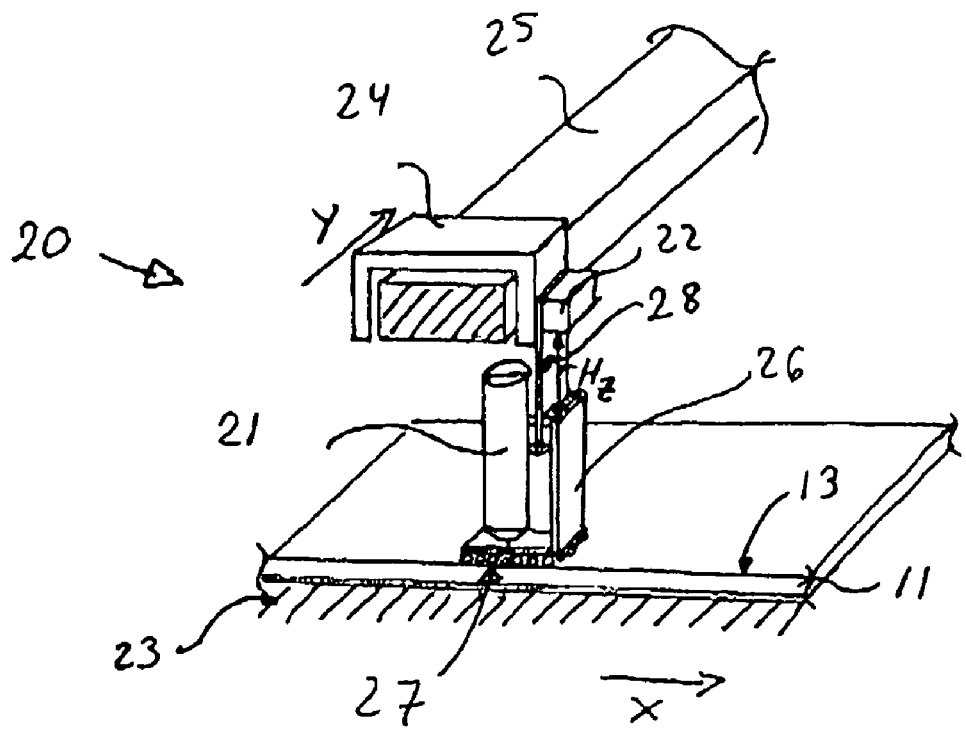
FIG. 2 shows a pattern generating apparatus according to prior art.

FIG. 2 shows a pattern generating apparatus 20, which also could be used as a measuring apparatus, including means to write a pattern 21, e.g. mirrors directing a laser beam from a laser, and means 22 to measure the height $H_z$ between the apparatus 20 and a glass plate 11 with the surface 13 on which the pattern is to be written is placed upwards on a support 23, so called stage. The pattern writing means 21 may be translated over the entire surface of the stage, which movement may be implemented in a number of ways. FIG. 2 illustrates one way where the stage is provided with means to move it in relation to the pattern writing means 21 in the x direction, and where the pattern writing means 21 is attached to a sliding support 24 arranged on a beam 25 to move the pattern writing means in the y direction. Other possible ways to implement the translation of the pattern writing means is to provide the means to move the stage in both x and y direction with a non-moving pattern writing means, or the pattern writing means could be provided with means to move in both x and y direction with a non-moving stage.

The apparatus 20 is also provided with an angled foot plate 26 arranged a constant distance above the surface 13 of the glass plate 11 by means of an air cushion 27. The foot plate 26 and the pattern writing means 21 are attached to the sliding support 24 via a flexible attachment 28, to allow the distance between the sliding support 24 and the pattern writing means/foot plate to vary dependent on the roughness of the surface 13 of the glass plate 11. The varying distance in the z direction, i.e. the height $H_z$, may be measured to calculate the roughness of the surface 13 in the z direction. The size of the foot plate that is parallel to the surface 13 of the glass plate 11 has an opening for a laser beam from the pattern writing means 21 and is preferably rather large, e.g. 5 mm on each side, since the purpose of the measurement is to detect deviations in height over a relatively large distance. The air cushion beneath foot plate will act as an auto focus device for the pattern generating apparatus due to the constant distance between the foot plate and the glass plate.

The invention should however not be limited to this kind of pattern generating apparatus using an air cushion as an auto focus device, but other types of systems that will provide focus for the system could be used. The essential part is that the apparatus 20 is provided with means to measure the height $H_z$ between the apparatus and the surface 13 of the glass plate 11 and thereby the variation in height when the pattern writing means 21 is moved in relationship to the stage 23, and thus the surface 13.

An essential part of the invention is to determine a reference surface against which the difference in height $H_z$ is calculated. This difference is denoted H, as is illustrated in connection with FIG. 3. The reference surface could have any desired shape as long as the shape of the reference surface is maintained unchanged. Preferably, the shape of the reference surface is a flat plane.

If it were possible, it may have been desirable to use the "free" (non gravity) form, i.e. the centre line of the plate as a reference surface, which is rather difficult to achieve in practise. The bottom surface of the plate is not a good alternative for a reference surface since a stepper or an aligner use the top surface as a reference.

On the other hand if the top surface would be used as a reference surface, there is an additional need to know the bottom shape of the plate and the shape of the support. The shape of the support may be obtained, but it is very difficult to achieve knowledge of the bottom surface in practice. The top surface may however be measured without the knowledge of the bottom surface. A large glass plate that is placed on a three-foot will be deformed due to the weight of the plate, but a deformation function for a perfect plate may be calculated if the thickness of the plate, the material of the plate and the configuration of the three-foot are known. A measurement of the non-perfect glass plate, when placed on the three-foot, will generate a measurement of the deformed plate. The shape of top surface is then calculated by subtraction the calculated deformation function for a perfect plate from the measurement of the deformed plate.

The top surface of a glass plate is normally much more even, i.e. less variation in height in relation to the centre line, compared to the bottom surface, and the best compromise should therefore be to make the top surface of the plate to be the reference surface. It should however be noted that it is not evident that the top surface is the best choice due to the deformation of the glass plate during the following step in the exposure system, as shown in FIG. 1. If the top surface 13 of the glass plate exhibits variations close to the position where it rests on the rulers 12, the pattern on the surface 13 will be distorted in a vicinity of the rulers 12.

It should however be noted that any surface may be used as reference surface, although the top side is preferred.

Figure 3:
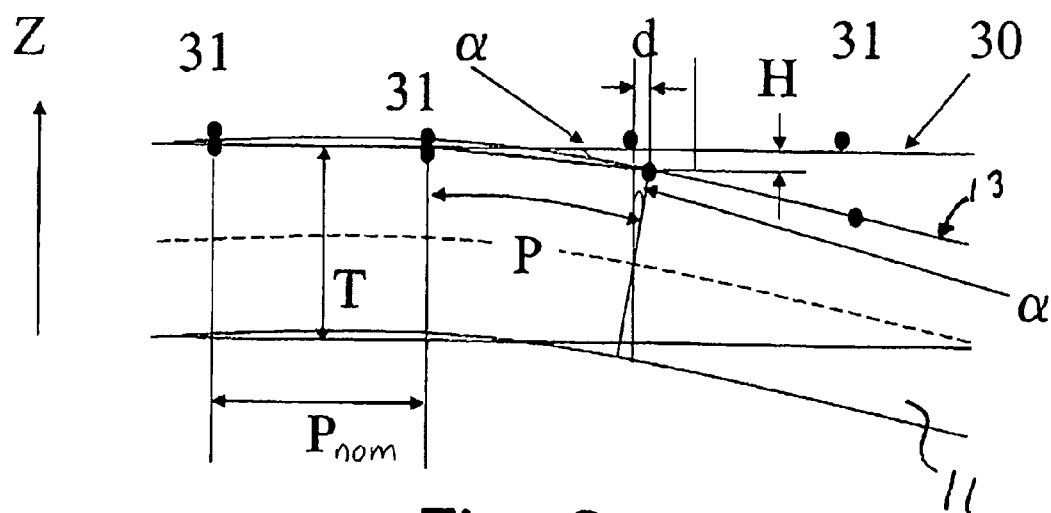
FIG. 3 illustrates the plate bending effect for calculating an offset according to the present invention.

FIG. 3 illustrates the plate bending effect for a glass plate 11 having a thickness T. A reference surface 30 is determined, in this example the reference surface is flat, and the glass plate is divided into several measurement points 31 and the height $H_z$ is measured at each measurement point by the means 22 shown in FIG. 2. The height H between the reference plane 30 and the deformed surface 13 of the glass plane 11 can easily be calculated by subtracting the height of the reference surface 30 at the measurement point from the height $H_z$ measured for the surface 13 of the glass plate 11 by the apparatus 20.

A local offset d (as a function of x and y) is thereafter calculated for each measurement point and depends on three variables: the thickness of the glass plate (T), the distance between adjacent measurement points (P) and the measured height (H) between the reference surface 30 and the surface 13 of the glass plate 11. The local offset should be interpreted as the position deviation from the position where a pattern should be written in relationship to the reference surface, as described in connection with FIGS. 4–6. The pitch P on the surface of the plate differs from the nominal pitch $P_{nom}$ on the reference surface.

The distance between adjacent measurement points should not exceed a predetermined distance, which is dependent on the required accuracy for the measurement to get a reasonable good result from the measurement. An example of maximum distance between adjacent measurement points is 50 mm if the thickness of the glass plate 11 is around 10 mm and the glass plate material is quartz. The distance between adjacent measurement points also vary dependent on the thickness of the glass plate to obtain the same measurement accuracy. The variations in thickness of the glass plate is may be around 10–15 μm, but could be larger. The measurement points could be randomly distributed across the surface 13, but are preferably arranged in a grid structure with a predetermined distance between each point, i.e. pitch, that is not necessarily the same in the x and y direction.

The local offset is a function of the gradient in x and y direction at each measurement point and could be calculated using very simple expressions.

An angle α may be calculated from the measured height H provided the distance P between two adjacent measurement points 31a is known.

For small angles α:

$$\alpha = \frac{H}{P}$$

Furthermore the local offset d may be calculated provided α is small using the formula:

$$d = \frac{T}{2} * \alpha = \frac{H*T}{2*P}$$

It should however be noted that the formula for calculating the local offset d above, only is a non-limiting example of a calculation to determine the offset d. The gradient in each measurement point could be directly measured by the system and the local offset is proportional to the gradient and the thickness of the plate.

As previously mentioned above, FIG. 3 illustrates the bending effect in one dimension, but the local offset d is a 2-dimensional function of the derivative in each measurement point (dx and dy).

As a non-limiting example we assume that the distance between two adjacent points 31 is 40 mm, the thickness of the glass plate is 10 mm, and that the measured height H is 1 μm, which will result in a one-dimensional local offset d of 125 nm.

Figures 4A, 4B:
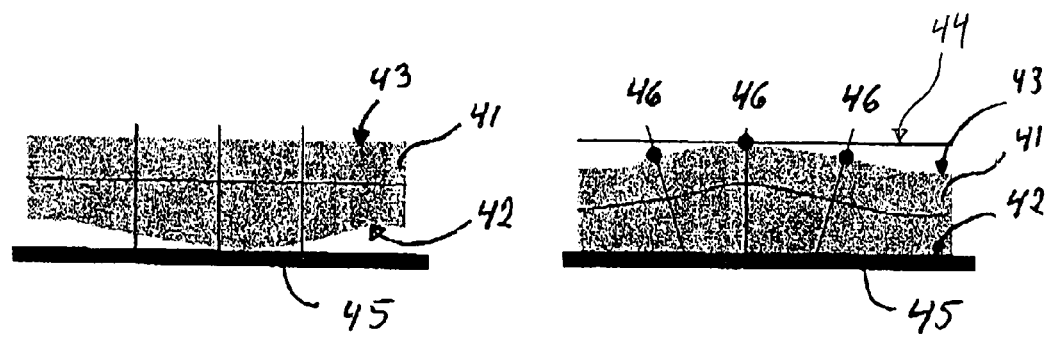
FIGS. 4a and 4b illustrate the plate bending effect a glass plate with a flat top and a shaped bottom and the introduction of a reference surface when arranged on a flat support.

FIGS. 4a and 4b illustrate the plate bending effect a glass plate 41 with a flat top surface 43 and a shaped bottom surface 42 and the introduction of a reference surface 44, which is flat in this example, when supported by a flat support 45.

When the glass plate 41 is arranged on the flat support 45, the shape of the top surface 43 is changed and the bottom surface 42 will generally follow the flat support 45. The result of this is that the pattern generated, illustrated by the dots 46 on the top surface, has to be expanded to obtain a correct reference surface.

Figure 5A:
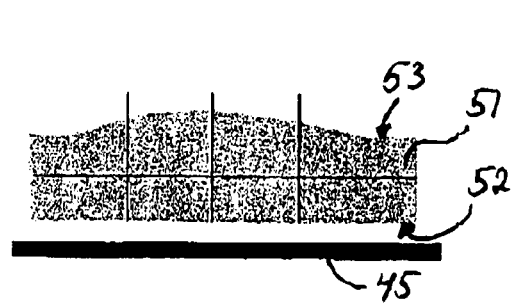
FIGS. 5a and 5b illustrate the plate bending effect a glass plate with a shaped top and a flat bottom and the introduction of a reference surface when arranged on a flat support.
Figure 5B:
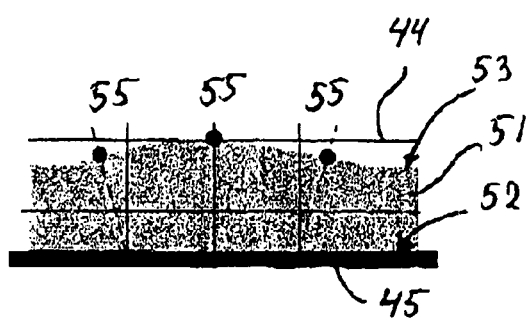

FIGS. 5a and 5b illustrate the plate bending effect a glass plate 51 with a shaped top surface 53 and a flat bottom surface 52 and the introduction of a reference surface 44, which is flat in this example, when arranged on a flat support 45.

When the glass plate 51 is arranged on the flat support 45, the shape of the top surface 43 is unchanged and the bottom surface 42 will follow the flat support 45. The pattern generated, illustrated by the dots 55 on the top surface, has to be expanded to obtain a correct reference surface, since the top surface will be flattened out when positioned in the exposure equipment as described in FIG. 1, at least in the vicinity of the rulers 12. The part of the glass plate positioned right between the rulers 12 will be deformed. Furthermore the rulers will deform the pattern on the glass plate unless the shape of the rulers 12 is in accordance with the shape of the reference surface.

Figure 6A:
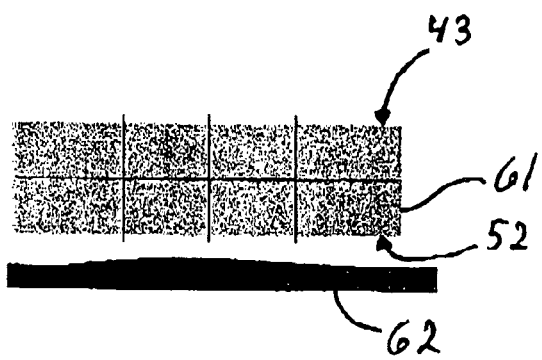
FIGS. 6a and 6b illustrate the plate bending effect a glass plate with a flat top and a flat bottom and the introduction of a reference surface when arranged on a shaped support.
Figure 6B:
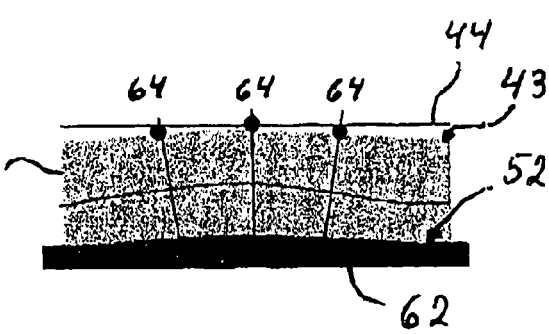

FIGS. 6a and 6b illustrate the plate bending effect a glass plate 61 with a flat top surface 43 and a flat bottom surface 52 and the introduction of a reference surface 44, which is flat in this example, when arranged on a shaped support 62.

When the glass plate 61 is arranged on the shaped support 62, the shape of the top surface 43 is changed and the bottom surface 42 will generally follow the shaped support 62. The pattern generated, illustrated by the dots 64 on the top surface, has to be expanded to obtain a correct reference surface, since the top surface will be flattened out when positioned in the exposure equipment as described in FIG. 1.

FIGS. 4a–4b, 5a–5b and 6a–6b illustrate extreme conditions and in reality all three variations are present during the process of writing a pattern on a glass plate.

Figure 8:
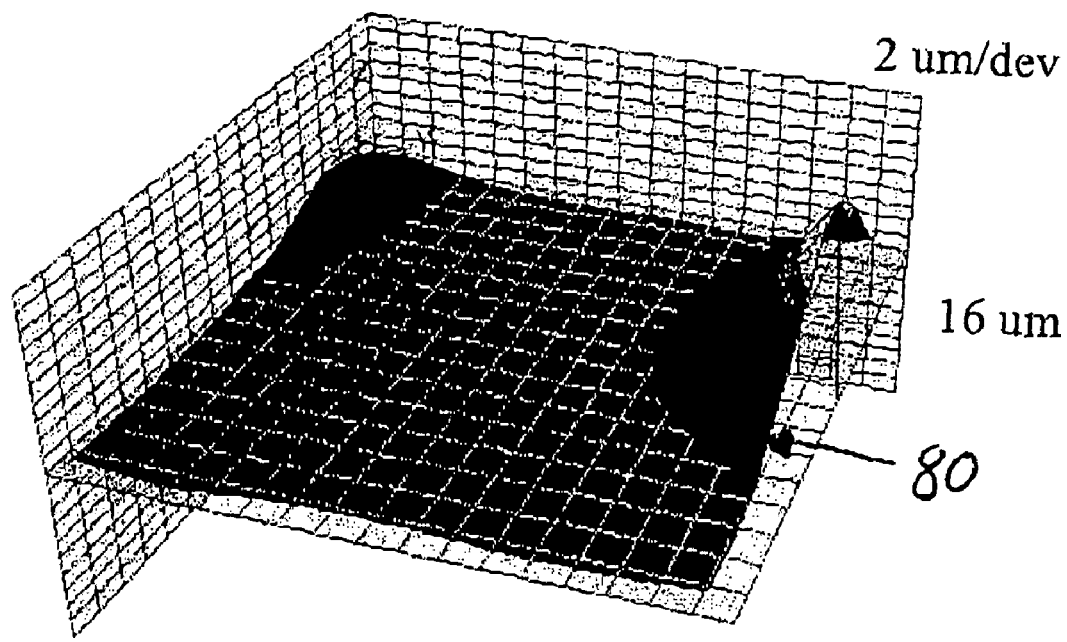
FIG. 8 shows a three-dimensional measurement of a glass plate with particles distorting the shape of the plate.
Figure 9A:
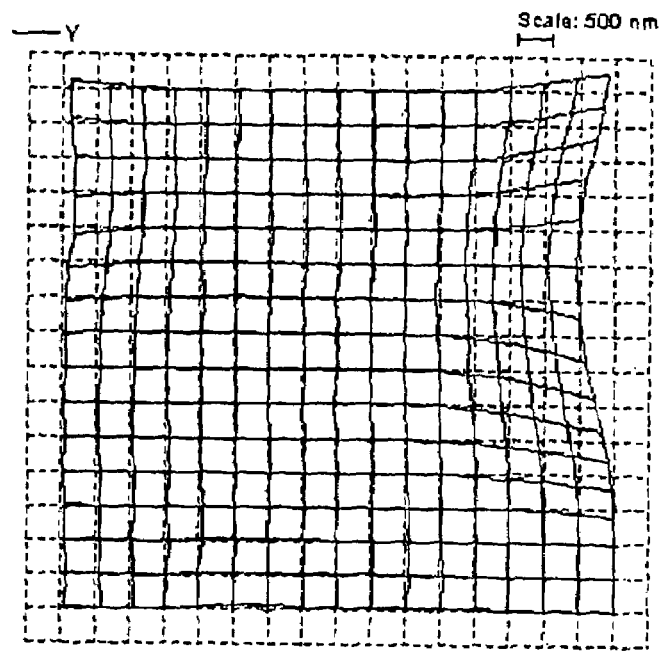
FIGS. 9a and 9b show measured x-y coordinates of the glass plate illustrated in FIG. 8, and the compensated x-y coordinates of the same glass plate using the correction function.
Figure 9B:
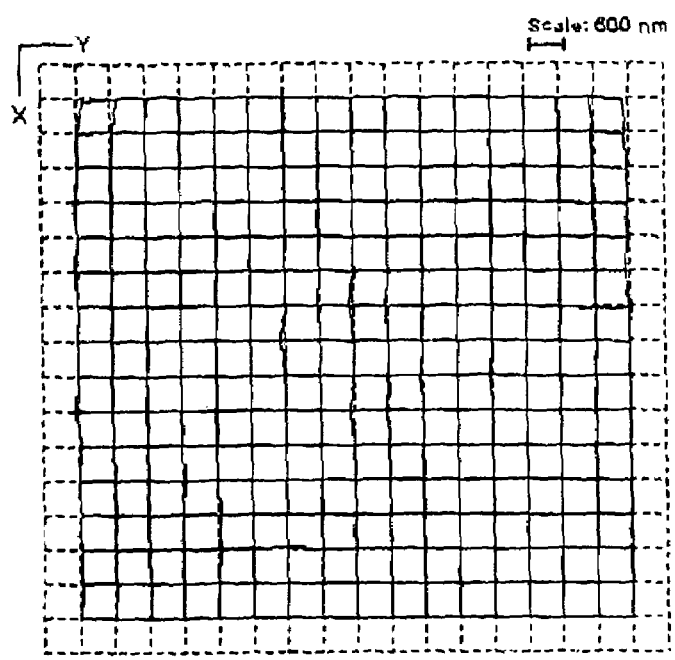

The overall error is however much smaller since all errors from the bottom surface, support surface and contamination, see FIG. 8, 9a and 9b, are eliminated or at least reduced.

Figure 7A:
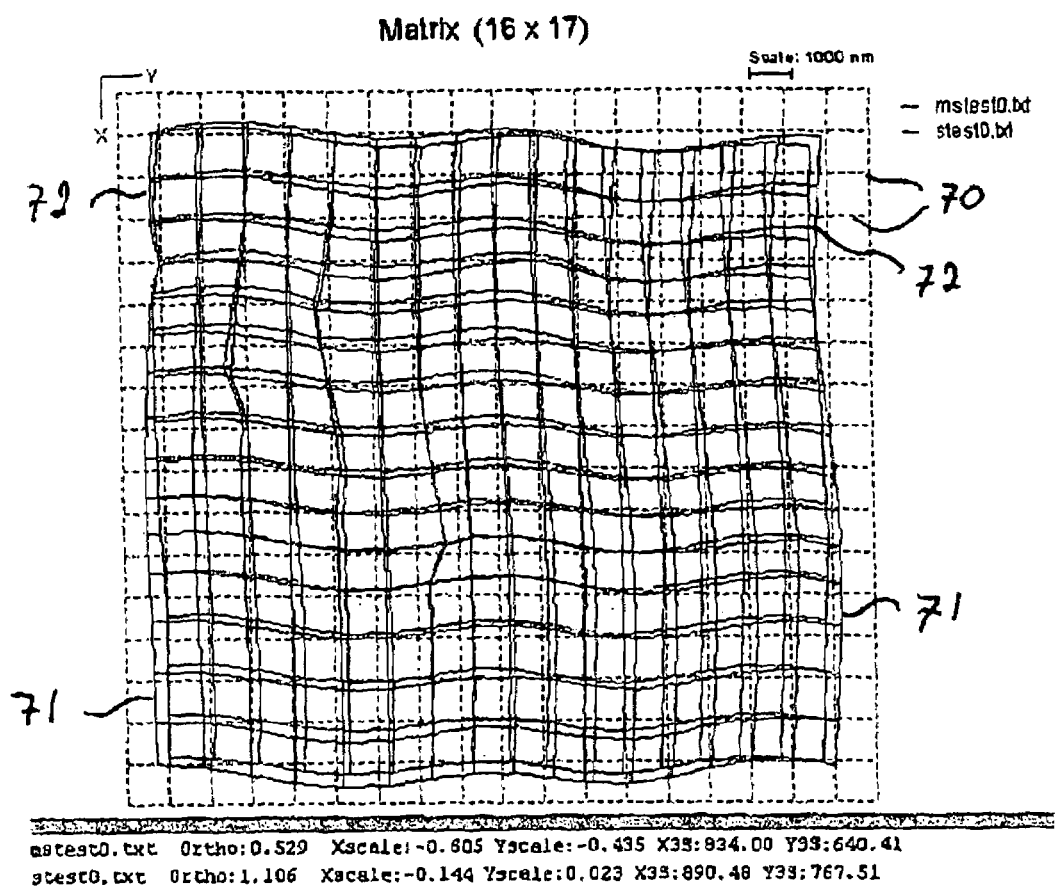
FIGS. 7a and 7b show measured x-y coordinates of a glass plate and compensated x-y coordinates of the same glass plate using the correction function.
Figure 7B:
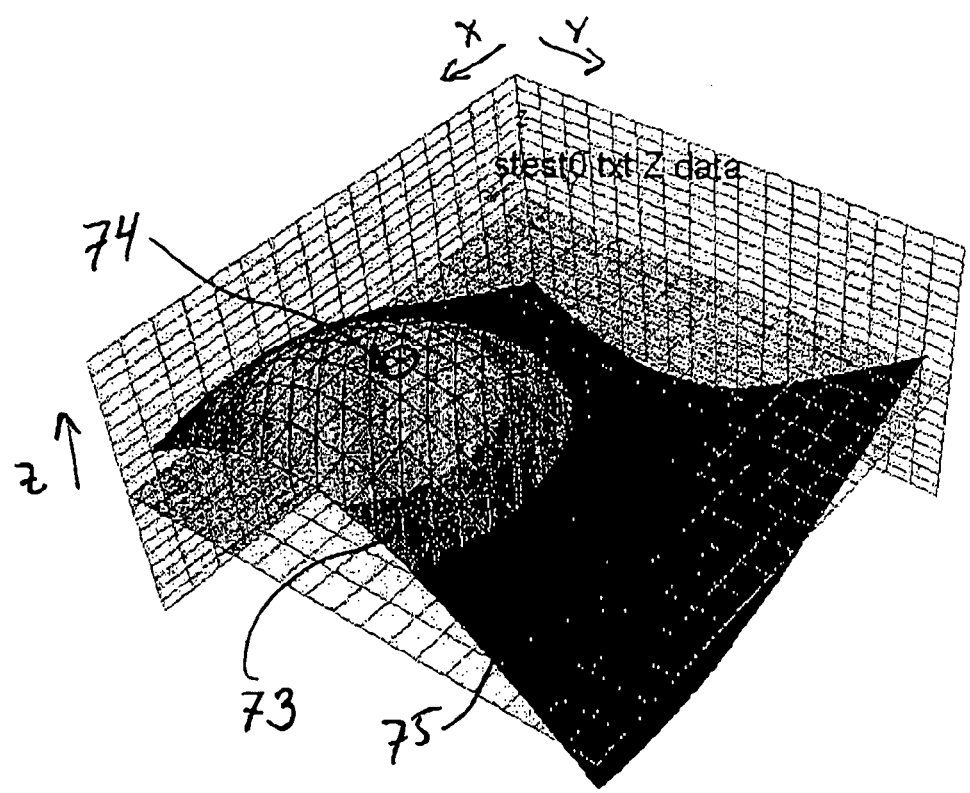
Figure 7C:
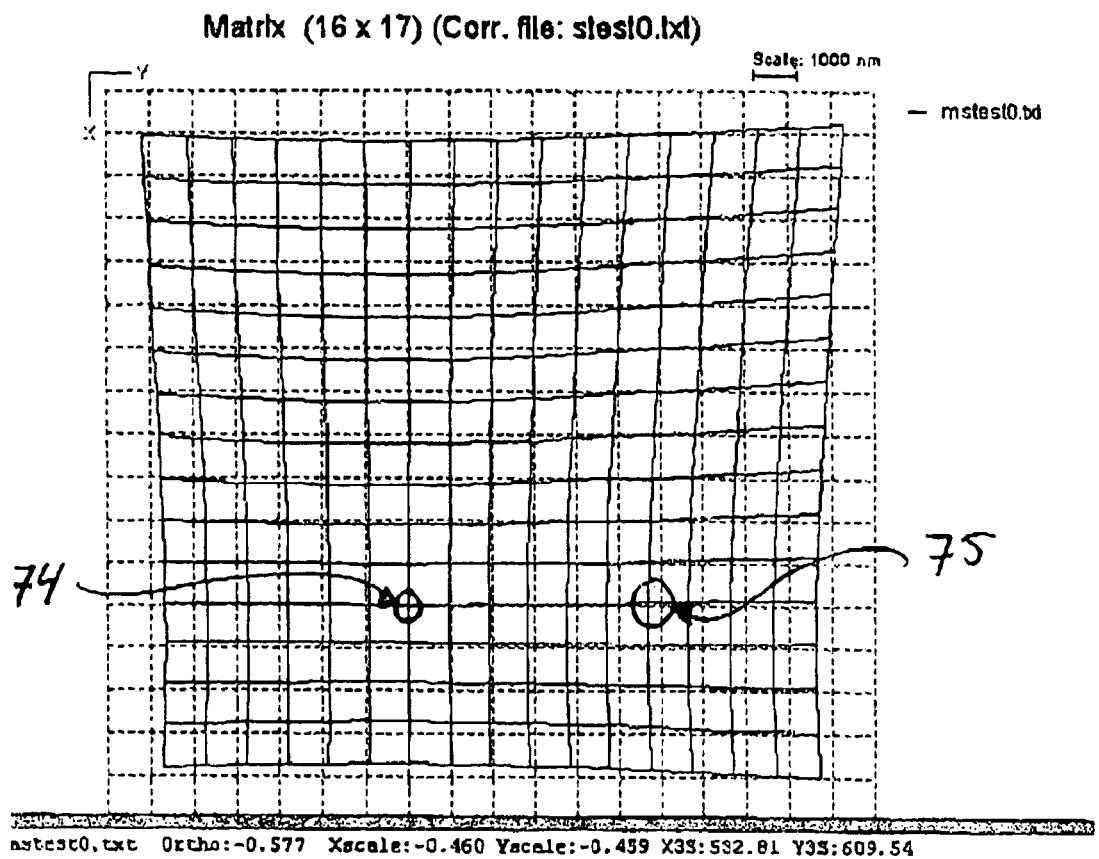
FIG. 7c shows the difference between the measurements without compensation and the measurements with compensation.

FIG. 7a shows measured x-y coordinates of a reference glass plate and compensated x-y coordinates of the same reference glass plate using a calculated correction function according to the present invention. FIG. 7b shows the measured height H (z correction data) obtained at the same time as the x and y coordinates for marks depicted on the surface of the reference glass plate. FIG. 7c shows the difference between the measurements without compensation and the measurements with compensation.

The size of the glass plate is in this example 800×800 mm, and the distance between each dashed line 70 in FIG. 7a is 50 mm, and the scale of the deviation of the two plotted charts are 500 nm between each dashed line 70. The grey lines 71 correspond to the measured deviation of the x and y coordinate on the reference glass plate. The black lines 72 correspond to the compensated x and y coordinates of the same reference glass plate using the Z correction effect based on the measured height H shown in FIG. 7b. The minimum height is −20.705 μm and the maximum height is +16.664 μm compared to the determined reference surface and the height H is depicted as a function 73. The distance between the lines in x and y direction is the same as in FIG. 7a, i.e. 50 mm, and the distance between the lines in z direction is 2 μm.

FIG. 7c clearly illustrates the deviations between the two functions in FIG. 7a. When comparing the measured height H in FIG. 7b with the deviation in FIG. 7c it is easy to see the relationship between the derivative of the height and the local offset. When the derivative of the height is zero, as in position 74, then the local offset d is zero. When the derivative of the height is high, as in position 75, then the local offset d is large.

A transition from a low H value to high H value corresponds to that the glass plate has a "negative" bend, as illustrated in FIG. 3, and vice versa. The calculated local offset, i.e. the difference between the grey and the black lines is largest when the change of the derivative of the height H in x and y direction is the highest.

FIG. 8 shows a three-dimensional measurement 80 of a glass plate with two present particles, placed between the plate and the support, having a height of 16 μm and 6 μm, respectively. The measurement was performed using a grid structure and the distance between the measurement points was set to 50 mm and the thickness of the plate was 10 mm. The scale in z direction was set to 2 μm per division. The presence of the large particle causes the x and y measurement illustrated in FIG. 9a to deviate more than 500 nm.

FIG. 9a shows measured x-y coordinates of the glass plate illustrated in FIG. 8, and FIG. 9b shows the compensated x-y coordinates of the same glass plate using the correction function calculated from the measured deviating height measurement in FIG. 8. The effect of particles will be greatly reduced on the final image generated on the glass plate as is illustrated in FIG. 9b.

Although a glass plate has been used as an illustrative example in the patent application, the scope of the claims should not be limited to a plate made of glass. Other types of objects having a surface are possible to use. An example of another object that could be used in the invention, is a semiconductor material. The measuring apparatus will measure the physical properties of the surface of the semiconductor material, and the pattern generating apparatus will directly write a pattern on a semiconductor material. Both the measuring feature and the pattern generating feature may also be implemented in a combined apparatus.

Furthermore, the pattern generating apparatus could of course include correction functions for any repeatable error, e.g. errors present in substrates for the manufacturing of TFT-arrays that are introduced in the substrates during the manufacture of the substrates, as well as repeatable errors introduced in the manufacturing process in the aligner, or stepper as previously mentioned.

The method may naturally be implemented into a computer program for performing the measurements, and calculating the local offset for each measurement point.

The invention claimed is:

1. A measuring apparatus for measuring the physical properties of a surface comprising:
   a stage supporting an object with a thickness (T) being provided with a surface, said surface being divided into a number of measurement points, where two adjacent measurement points being spaced a distance apart not exceeding a predetermined maximum distance,
   means to determine the gradient of the surface at each measurement point,
   means to calculate a 2-dimensional local offset (d) in the x-y plane for each measurement point as a function of the gradient, and the thickness (T) of object, and
   means to determine a correction function for the surface using the calculated 2-dimensional local offset (d) for each measurement point.

2. The measuring apparatus according to claim 1, wherein the means to determine the gradient comprises means to measure the variation in height of the surface at each measurement point.

3. The measuring apparatus according to claim 2, wherein the means to measure the variations in height of the surface comprises:
   means to determine a reference surface,
   means to measure the height (H) between the reference surface and the surface of the object at each measurement point, whereby
      the 2-dimensional local offset (d) is the x-y plane may be calculated as a function of the measured height (H), the distance (P) from each at least adjacent measurement point, and the thickness (T) of the object.

4. The measuring apparatus according to claim 1, wherein the object is a reference object, and said surface is provided with marks at each measurement point.

5. The measuring apparatus according to claim 1, wherein the measurement points on the object are arranged in a grid pattern having a first predetermined pitch in the x direction and a second predetermined pitch in the y direction.

6. The measuring apparatus according to claim 1, wherein the measurement points on the object are arbitrarily arranged.

7. A pattern generating apparatus for writing a pattern on a surface of an object, comprising:
   a stage supporting an object with a thickness (T) being provided with a surface, said surface being divided into a number of measurement points, where two adjacent measurement points being spaced a distance apart not exceeding a predetermined maximum distance,
   means to determine the gradient of the surface at each measurement point,
   means to calculate a 2-dimensional local offset (d) in the x-y plane for each measurement point as a function of the gradient, and the thickness (T) of object, and
   means to correct the pattern to be written on said surface by using the 2-dimensional local offset (d).

8. The pattern generating apparatus according to claim 7, wherein the means to correct the pattern comprises:
   means to determine a correction function for the surface using the calculated 2-dimensional local offset (d) for each measurement point, and
   means to write the pattern on the surface using the correction function with the pattern generating apparatus.

9. The pattern generating apparatus according to claim 7, wherein the means to determine the gradient comprises means to measure the variation in height of the surface at each measurement point.

10. The pattern generating apparatus according to claim 9, wherein the means to measure the variations in height of the surface comprises:
    means to determine a reference surface,
    means to measure the height (H) between the reference surface and the surface of the object at each measurement point,
whereby the 2-dimensional local offset (d) in the x-y plane may be calculated as a function of the measured height (H), the distance (P) from each at least one adjacent measurement point, and the thickness (T) of the object.

11. The pattern generating apparatus according to claim 10, wherein the local offset (d) is calculated using the formula:

$$d=(T*H)/(2*P).$$

12. The pattern generating apparatus according to claim 7, wherein the measurement points on the object are arranged in a grid pattern having a first predetermined pitch in the x direction and a second predetermined pitch in the y direction.

13. The pattern generating apparatus according to claim 7, wherein the measurement points on the object are arbitrarily arranged.

14. The pattern generating apparatus according to claim 10, wherein the height (H) between the reference surface and the surface of the object originate from unevenness of the stage, and/or unevenness of one or both surfaces of the object and/or undesired objects arranged between the stage and the object.

15. The pattern generating apparatus according to claim 14, wherein the undesired objects may be trapped air or particles.

16. The pattern generating apparatus according to claim 7, wherein the top surface of the object carries the pattern.

17. The pattern generating apparatus according to claim 7, wherein the apparatus is provided with means to calculate the correction function to also compensate for expected deformation from the exposure equipment during subsequent processing steps.

18. The pattern generating apparatus according to claim 7, wherein the object is intended for use in exposure equipment.

19. The pattern generating apparatus according to claim 18, wherein the object is a glass plate and a pattern is generated on the glass plate to be used when writing a pattern on a semiconductor material using the exposure equipment.

20. The pattern generating apparatus according to claim 7, wherein the object is a semiconductor material and a pattern is directly generated on the surface of the semiconductor material.

21. A computer program for performing the following steps:
   determining the gradient of the surface at each measurement point being defined on a surface of an object having a thickness (T),
   calculating a 2-dimensional local offset (d) in the x-y plane for each measurement point as a function of the gradient, and the thickness (T) of object, and
   determining a correction function for the surface, or correcting a pattern to be written on said surface, using the calculated 2-dimensional local offset (d) for each measurement point.

22. A computer program product for carrying the computer program as defined in claim 21.

23. A method for writing a pattern on a surface intended for use in exposure equipment, comprising the steps of:
   arranging an object having a thickness (T) provided with a surface on a stage of a pattern generating apparatus,
   dividing the surface into a number of measurement points, where two adjacent measurement points being spaced a distance (P) apart not exceeding a predetermined maximum distance,
   determining the gradient of the surface at each measurement point,
   calculating a 2-dimensional local offset (d) in the x-y plane for each measurement point as a function of the gradient, and the thickness (T) of object, and
   correcting the pattern to be written on said surface by using the 2-dimensional local offset (d).

24. The method according to claim 23, wherein the step of correcting the pattern comprises the steps:
   determining a correction function for the surface using the calculated 2-dimensional local offset (d) for each measurement point, and
   writing the pattern on the surface using the correction function with the pattern generating apparatus.

25. The method according to claim 23, wherein the step of determining the gradient comprises measuring the variation in height of the surface at each measurement point.

26. The method according to claim 25, wherein the step of measuring the variations in height of the surface comprises the steps of:
   determining a reference surface,
   measuring the height (H) between the reference surface arid the surface of the object at each measurement point, whereby
      the 2-dimensional local offset (d) in the x-y plane may be calculated as a function of the measured height (H), the distance (P) from each at least one adjacent measurement point, and the thickness (T) of the object.

27. The method according to claim 26, wherein the local offset (d) is calculated using the formula:

$$d=(T*H)/(2*P).$$

28. The method according to claim 25, wherein the measurement points are arranged in a grid structure having a first predetermined pitch in the x direction and a second predetermined pitch in the y direction.

29. The method according to claim 26, wherein the height (H) between the reference surface and the surface of the object originate from unevenness of the stage, and/or unevenness of one or both surfaces of the object and/or undesired objects arranged between the stage and the object.

30. The method according to claim 29, wherein the undesired objects may be trapped air or particles.

31. The method according to claim 23, wherein the top surface of the object is selected to carry the pattern.

32. The method according to claim 23, wherein the correction function also compensates for expected deformation from the exposure equipment during subsequent processing steps.

33. A method for measuring the physical properties of a surface, including the steps of:
   arranging an object having a thickness (T) provided with a surface on a stage of a measuring apparatus,
   dividing a glass plate into a number of measurement point, where two adjacent measurement points being spaced a distance apart not exceeding a predetermined maximum distance,
   determining the gradient of the surface at each measurement point,
   calculating a 2-dimensional local offset (d) in the x-y plane for each measurement point as a function of the gradient, and the thickness (T) of object, and
   determining a correction function for the surface using the calculated 2-dimensional local offset (d) for each measurement point.

34. The method according to claim 33, wherein the step of determining the gradient comprises measuring the variation in height of the surface at each measurement point.

35. The method according to claim 34, wherein the step of measuring the variations in height of the surface comprises the steps of:
   determining a reference surface,
   measuring the height (H) between the reference surface and the surface of the object at each measurement point, whereby
      the 2-dimensional local offset (d) in the x-y plane may be calculated as a function of the measured height (H), the distance (P) from each at least one adjacent measurement point, and the thickness (T) of the object.

36. The method according to claim 33, wherein the object is a reference object, and said surface is provided with marks at each measurement point.

* * * * *